(12) United States Patent
Dohner et al.

(10) Patent No.: US 11,121,339 B2
(45) Date of Patent: Sep. 14, 2021

(54) QUANTUM DOT LED DESIGN BASED ON RESONANT ENERGY TRANSFER

(71) Applicant: Nanosys, Inc., Milpitas, CA (US)

(72) Inventors: Emma Rose Dohner, Redwood City, CA (US); Yeewah Annie Chow, San Jose, CA (US); Wenzhuo Guo, San Jose, CA (US); Christian Justus Ippen, Sunnyvale, CA (US); Jason Travis Tillman, Newark, CA (US); Jonathan Andrew Truskier, Oakland, CA (US)

(73) Assignee: Nanosys, Inc., Milpitas, CA (US)

( * ) Notice: Subject to any disclaimer, the term of this patent is extended or adjusted under 35 U.S.C. 154(b) by 48 days.

(21) Appl. No.: 16/406,930

(22) Filed: May 8, 2019

(65) Prior Publication Data

US 2019/0348623 A1    Nov. 14, 2019

Related U.S. Application Data

(60) Provisional application No. 62/670,201, filed on May 11, 2018.

(51) Int. Cl.
*H01L 51/50* (2006.01)
*H01L 51/56* (2006.01)

(52) U.S. Cl.
CPC ........ *H01L 51/502* (2013.01); *H01L 51/5072* (2013.01); *H01L 51/56* (2013.01); *H01L 2251/303* (2013.01); *H01L 2251/5369* (2013.01)

(58) Field of Classification Search
None
See application file for complete search history.

(56) References Cited

U.S. PATENT DOCUMENTS

| 9,199,842 B2 | 12/2015 | Dubrow et al. |
| 9,761,822 B2 * | 9/2017 | Kim .................. H01L 27/3262 |

(Continued)

FOREIGN PATENT DOCUMENTS

| CN | 106450013 A | * | 2/2017 | |
| CN | 108550707 A | * | 9/2018 | ......... H01L 27/3209 |
| WO | WO 2011/147522 A1 | | 12/2011 | |

OTHER PUBLICATIONS

Hyeong Kim; D. et al., "Flexible Memristive Devices Based on InP/ZnSe/ZnS Core—Multishell Quantum Dot Nanocomposites," ACS Appl. Mater. Interfaces 10(17): 14843-9, American Chemical Society, United States (2018).

(Continued)

*Primary Examiner* — Robert K Carpenter
(74) *Attorney, Agent, or Firm* — Sterne, Kessler, Goldstein & Fox P.L.L.C.

(57) ABSTRACT

Embodiments of the present application relate to illumination devices using luminescent nanostructures. An illumination device includes a first conductive layer, a second conductive layer, a hole transport layer, an electron transport layer and a material layer that includes a plurality of luminescent nanostructures. The hole transport layer and the electron transport layer are each disposed between the first conductive layer and the second conductive layer. The material layer is disposed between the hole transport layer and the electron transport layer and includes one or more discontinuities in its thickness such that the hole transport layer and the electron transport layer contact each other at the one or more discontinuities. Resonant energy transfer occurs between the luminescent nanostructures and excitons at the discontinuities.

16 Claims, 9 Drawing Sheets

(56) References Cited

U.S. PATENT DOCUMENTS

| | | | |
|---|---|---|---|
| 2012/0018749 A1* | 1/2012 | Lee | H01L 27/3211 |
| | | | 257/89 |
| 2012/0113672 A1 | 5/2012 | Dubrow et al. | |
| 2015/0263314 A1* | 9/2015 | Sakuishi | H01L 51/5012 |
| | | | 438/28 |
| 2018/0205030 A1* | 7/2018 | Meng | H01L 51/508 |

OTHER PUBLICATIONS

Ippen; C. et al., "InP/ZnSe/ZnS: A Novel Multishell System for InP Quantum Dots for Improved Luminescence Efficiency and Its application in a Light-Emitting Device," Journal of Information Display 13(2): 91-5, Taylor & Francis Group, LLC, England (2012).
International Search Report and Written Opinion for International Application No. PCT/US2019/031495, European Patent Office, Netherlands, dated Sep. 4, 2019, 20 pages.

* cited by examiner

QUANTUM DOT LED DESIGN BASED ON RESONANT ENERGY TRANSFER

CROSS REFERENCE TO RELATED APPLICATIONS

This application incorporates by reference in their entirety U.S. Provisional Appl. No. 62/670,201, filed May 11, 2018.

FIELD

The present application relates to quantum dot emission technology, and to illumination devices using quantum dots.

BACKGROUND

Semiconductor nanocrystallites (quantum dots) whose radii are smaller than the bulk exciton Bohr radius constitute a class of materials intermediate between molecular and bulk forms of matter. Quantum confinement of both the electron and hole in all three dimensions leads to an increase in the effective band gap of the material with decreasing crystallite size. Consequently, both the optical absorption and emission of quantum dots shift to the blue (higher energies) as the size of the dots gets smaller. Incorporating quantum dots in display devices, such as LCDs, has been shown to produce highly vibrant colors while reducing the overall power consumption. Quantum dots provide desirable characteristics due to their low power consumption, low manufacturing cost, and highly vibrant light output.

Recently, quantum dots have been incorporated into light emitting diodes (QD-LEDs) where an emissive layer including the quantum dots has both electrons and holes injected into it, thus stimulating the energy states of the quantum dots. CdSe-based red QD-LEDs have been reported with external quantum efficiencies (EQE) of over 20%, close to the theoretical limit for QD-LED efficiency. In contrast, the best reported InP-based QD-LEDs have EQEs of only 2.3% (red) and 3.5% (green). This discrepancy may be partially due to the quenching that InP quantum dots exhibit when deposited into close-packed films. One approach to counteract low quantum yield of the quantum dots is to increase the shell thickness around the core material. However, increasing the shell thickness also increases the barrier to charge injection and transport into and between the quantum dots, thus requiring higher voltages to reach relevant levels of brightness. These high operating voltages result in devices with poor power efficiency as well as decreased stability.

SUMMARY

Embodiments of the present application relate to devices using quantum dots having both improved quantum yield and relatively low operating voltages.

According to an embodiment, an illumination device includes a first conductive layer, a second conductive layer, a hole transport layer, an electron transport layer and a plurality of luminescent nanostructures. The hole transport layer and the electron transport layer are each disposed between the first conductive layer and the second conductive layer. In one embodiment, the plurality of luminescent nanostructures is disposed in a separate layer between the electron transport layer and the hole transport layer, the separate layer having a plurality of discontinuities through a thickness of the separate layer such that the hole transport layer and the electron transport layer contact each other at the plurality of discontinuities. The discontinuities may form a random or regular pattern. In another embodiment, the plurality of luminescent nanostructures is disposed in the electron transport layer. In another embodiment, the plurality of luminescent nanostructures is disposed in the hole transport layer. In another embodiment, the plurality of luminescent nanostructures is disposed in a mixed layer that includes both the hole transport layer and the electron transport layer.

According to another embodiment, a QD-LED device includes a layer stack having a first conductive layer, a second conductive layer, a hole transport layer, an electron transport layer and a layer that includes a plurality of quantum dots. The hole transport layer and the electron transport layer are each disposed between the first conductive layer and the second conductive layer. In one embodiment, the plurality of quantum dots is disposed in a separate layer between the electron transport layer and the hole transport layer, the separate layer having a plurality of discontinuities through a thickness of the separate layer such that the hole transport layer and the electron transport layer contact each other at the plurality of discontinuities. The discontinuities may form a random or regular pattern. In another embodiment, the plurality of quantum dots is disposed in the electron transport layer. In another embodiment, the plurality of quantum dots is disposed in the hole transport layer. In another embodiment, the plurality of quantum dots is disposed in a mixed layer that includes both the hole transport layer and the electron transport layer. The QD-LED device also includes a first contact coupled to the first conductive layer, a second contact coupled to the second conductive layer, and an encapsulating material that surrounds the layer stack.

An example method of forming an illumination device includes disposing a first material over a conductive substrate to form a first material layer, where the first material layer is a hole transport layer or an electron transport layer. The method further includes disposing a layer of luminescent nanostructures over the first material layer. The layer of luminescent nanostructures includes a plurality of discontinuities in a thickness of the layer of luminescent nanostructures. The method also includes disposing a second material over the layer of luminescent nanostructures to form a second material layer, where the second material is an electron transport layer or a hole transport layer. The second material layer contacts the first material layer at the plurality of discontinuities of the layer of luminescent nanostructures. The method also includes disposing a conductive material over the second material layer.

Another example method of forming an illumination device includes disposing a first material over a conductive substrate to form a first material layer, where the first material layer is a hole transport layer. The method further includes disposing a second material over the first material layer to form a second material layer, wherein the second material layer is an electron transport layer and includes a plurality of luminescent nanostructures. The method also includes disposing a conductive material over the second material layer.

Another example method of forming an illumination device includes disposing a first material over a conductive substrate to form a first material layer, where the first material layer is a hole transport layer and includes a plurality of luminescent nanostructures. The method further includes disposing a second material over the first material layer to form a second material layer, wherein the second material layer is an electron transport layer. The method also includes disposing a conductive material over the second material layer.

Another example method of forming an illumination device includes disposing a mixed material layer over a conductive substrate, where the mixed material layer includes electron transport material, hole transport material, and a plurality of luminescent nanostructures. The method also includes disposing a conductive material over the mixed material layer.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present embodiments and, together with the description, further serve to explain the principles of the present embodiments and to enable a person skilled in the relevant art(s) to make and use the present embodiments.

Figure 1:
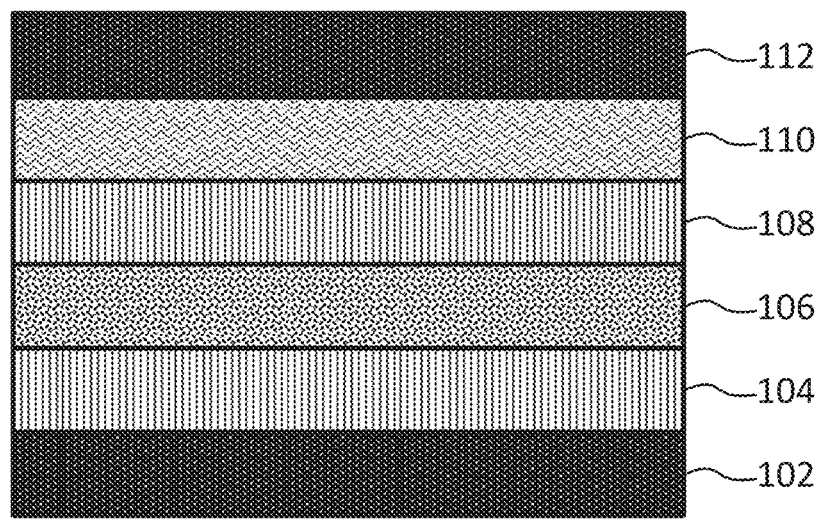
FIG. 1 illustrates a standard LED structure using luminescent nanoparticles.

The features and advantages of the present embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

Terms Used Herein

In embodiments, the term "display device" refers to an arrangement of elements that allow for the visible representation of data on a display screen. Suitable display screens may include various flat, curved or otherwise-shaped screens, films, sheets or other structures for displaying information visually to a user. Display devices described herein may be included in, for example, display systems encompassing a liquid crystal display (LCD), televisions, computers, mobile phones, smart phones, personal digital assistants (PDAs), gaming devices, electronic reading devices, digital cameras, tablets, wearable devices, car navigation systems, and the like.

The term "about" as used herein indicates the value of a given quantity varies by ±10% of the value. For example, "about 100 nm" encompasses a range of sizes from 90 nm to 110 nm, inclusive.

The term "substantially" as used herein indicates the value of a given quantity varies by ±1% to ±5% of the value.

In embodiments, the term "forming a reaction mixture" or "forming a mixture" refers to combining at least two components in a container under conditions suitable for the components to react with one another and form a third component.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (QY) as used herein refers to the ratio of photons emitted to photons absorbed, e.g., by a nanostructure or population of nanostructures. As known in the art, quantum yield is typically determined by a comparative method using well-characterized standard samples with known quantum yield values.

The term "primary emission peak wavelength" as used herein refers to the wavelength at which the emission spectrum exhibits the highest intensity.

The term "full width at half-maximum" (FWHM) as used herein refers to refers to a measure of spectral width. In the case of an emission spectrum, a FWHM can refer to a width of the emission spectrum at half of a peak intensity value.

The term Forster radius used herein is also referred as Forster distance in the art.

The terms "luminance" and "brightness" are used herein interchangeably and refer to a photometric measure of a luminous intensity per unit area of a light source or an illuminated surface.

The term "radiance" as used herein refers to a radiometric measure of a radiant intensity per unit area of a light source or an illuminated surface.

The term "nanostructure (NS) film" is used herein to refer to a film having luminescent nanostructures.

The term "luminance" is used herein to refer to a light intensity per unit area of an emissive surface.

The published patents, patent applications, websites, company names, and scientific literature referred to herein are hereby incorporated by reference in their entirety to the same extent as if each was specifically and individually indicated to be incorporated by reference. Any conflict between any reference cited herein and the specific teachings of this specification shall be resolved in favor of the latter. Likewise, any conflict between an art-understood definition of a word or phrase and a definition of the word or phrase as specifically taught in this specification shall be resolved in favor of the latter.

Technical and scientific terms used herein have the meaning commonly understood by one of skill in the art to which the present application pertains, unless otherwise defined. Reference is made herein to various methodologies and materials known to those of skill in the art.

Overview

This disclosure provides various embodiments of nanostructure-based light emitting diodes (LEDs) that may be used in display devices. In some embodiments, the LEDs include quantum dots (QD) exhibiting a relatively high quantum yield compared to the relatively low operating voltage of the LED. Various embodiments of the structure and method of making the QD-LEDs are described herein.

Nanostructure-Based Led Design

FIG. 1 illustrates an example of an LED device 100 that uses luminescent nanostructures as the light-producing medium. LED device 100 includes a stacked configuration of different layers to provide a voltage across a polymer layer that includes a plurality of luminescent nanostructures, such as quantum dots. If quantum dots are used as the luminescent nanostructures, LED device 100 may be referred to as a QD-LED device. LED device 100 includes a first conductive layer 102 upon which a stack of additional layers are formed. First conductive layer 102 may be a transparent conductive material, such as indium tin oxide (ITO). First conductive layer 102 may act as either the anode or cathode of LED device 100 depending on the configuration of the additional layers. In the example where LED device 100 includes an electron transport layer 104 on first conductive layer 102, the first conductive layer 102 acts as the cathode of LED device 100.

Electron transport layer 104 is designed to inject electrons under an applied electric field into a material layer 106 that includes a plurality of luminescent nanostructures. Similarly, a hole transport layer 108 injects holes into material layer 106 under the same applied electric field. The electric field is applied between first conductive layer 102 and a second conductive layer 112 formed at the top of the layer stack. Second conductive layer 112 may comprise a metal, such as aluminum, gold, or silver, and may act as the anode of LED device 100. In some examples, each of first conductive layer 102 and second conductive layer 112 is substantially transparent to visible light. The luminescent nanostructures in material layer 106 become electroluminescent as the charges injected through the opposite sides of material layer 106 recombine to produce emission that is characteristic to band-gap or trap sites. Some examples of LED device 100 also include a hole injection layer 110 designed to facilitate hole injection from the anode into the hole transport layer 108.

Examples of luminescent nanostructures include quantum dots having a semiconductor core material having a direct, or nearly direct, bandgap. Examples of QD core materials include various III-V semiconductor compounds such as indium phosphide (InP), cadmium selenide (CdSe), and gallium arsenide (GaAs). The semiconductor core is often surrounded by a shell material having a wide bandgap. One example shell material is zinc selenide (ZnSe). Further details about the colloidal growth and composition of QDs to be used within the QD-LED structures is discussed herein with reference to FIGS. 9-10.

The luminescent nanostructures within material layer 106 may be suspended in material that is substantially transparent to visible light. Material layer 106 may include a polymer that encapsulates and protects the luminescent nanostructures suspended within it. Example materials for use in material layer 106 include acrylates, epoxies, acrylated epoxies, ethylene-vinyl acetate, thiol-enes, polyurethane, polyethers, polyols, and polyesters. In one example, luminescent nanostructures are mixed within an amino silicone liquid and are emulsified into an epoxy resin that is coated to form material layer 106. Further details regarding the fabrication and operation of a quantum dot enhancement film, one example of material layer 106, may be found in U.S. Pat. No. 9,199,842, the disclosure of which is incorporated herein by reference.

In a typical QD-LED structure, the injection of electrons and holes into material layer 106 stimulates the QDs present in material layer 106, thus requiring a high enough activation voltage to penetrate the shell structure. While thicker shells provide better environmental protection of the QDs and enhanced quantum yield, they also require higher activation voltages, leading to a higher power consumption and poorer overall efficiency.

According to some embodiments, LED structures are described that utilize a different mechanism for stimulating the luminescent nanostructures (e.g., quantum dots). Rather than using direct carrier injection to stimulate the luminescent structures, the luminescent nanostructures are stimulated instead by resonant energy transfer from the creation of excitons in the adjacent electron transport layer. The resonant energy transfer forms an exciton on the core of the luminescent nanostructures, which then recombines radiatively (e.g., as produced light.)

Figure 2:
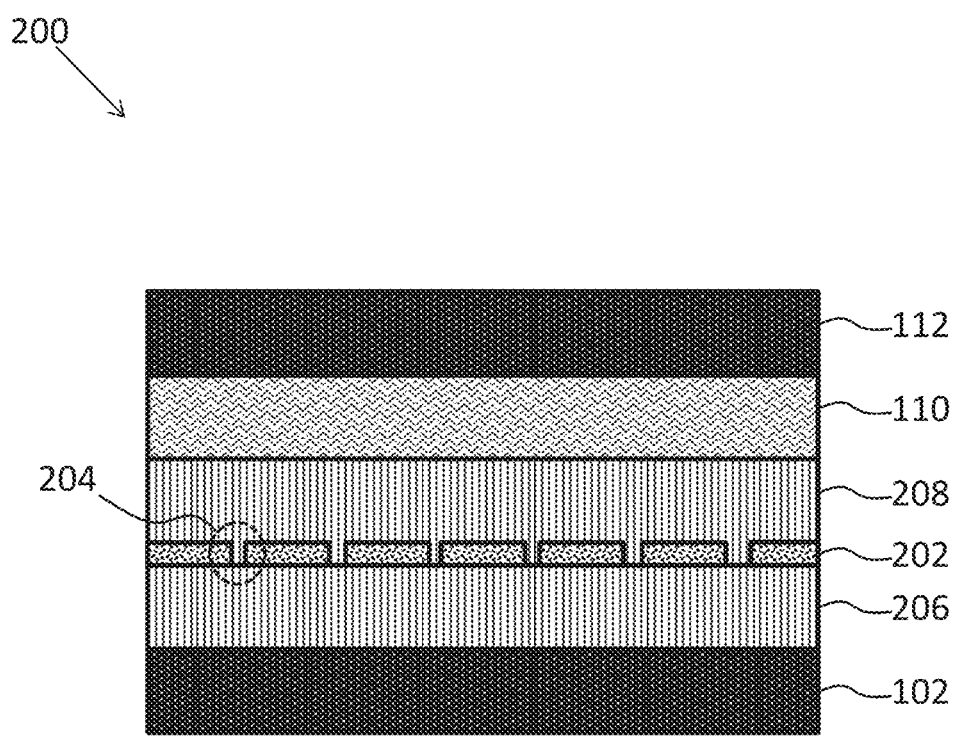
FIG. 2 illustrates an LED structure using luminescent nanoparticles, according to an embodiment.

FIG. 2 illustrates an example of an LED structure 200 that utilizes luminescent nanostructures, according to an embodiment. Many of the layers of LED structure 200 share the same labels, and/or are functionally similar to, the layers of LED structure 100. For the sake of clarity, these layers will not be described again. According to an embodiment, LED structure 200 includes a material layer 202 having a plurality of luminescent nanostructures, such as quantum dots. Material layer 202 may be formed to be very thin, for example, less than a few monolayers thick, or only one monolayer thick, where a monolayer may be about 10 nm thick. The low thickness of material layer 202 facilitates the formation of discontinuities 204 through the thickness of material layer 202, according to an embodiment. Discontinuities 204 may have any shape or pattern. In some examples, discontinuities 204 are randomly spread across the surface of material layer 202. In other examples, discontinuities 204 are formed in a specific pattern, or encouraged to form, using one or more applied techniques, such as etching. In another example, material layer 202 may be formed by spin-coating a solution containing a diluted concentration of luminescent nanostructures to encourage the formation of discontinuities.

Because of the presence of discontinuities 204, an electron transport layer 206 and a hole transport layer 208 contact one another via discontinuities 204. The contact may form when the deposition of hole transport layer 208 over material layer 202 also deposits within discontinuities 204, thus contacting the lower electron transport layer 206. This electrical "short" between the electron and hole transport layers is traditionally avoided as no (or very little) injection of carriers into material layer 202 occurs in this situation. However, the direct contact between electron transport layer 206 and hole transport layer 208 allows holes to be injected into mid-bandgap defect states in electron transport layer 206, combining with electrons injected from the cathode to form excitons. Due to the proximity between the luminescent nanostructures and the excitons created in the electron transport layer 206, the excitons resonantly transfer energy to the luminescent nanostructures, yielding highly efficient emission from the luminescent nanostructures with little to no parasitic emission from defect states of electron transport layer 206. Using zinc magnesium oxide (ZnMgO) as the electron transport layer, or a material comprising ZnMgO nanoparticles as the electron transport layer, has shown to provide highly efficient energy transfer between the formed excitons and the luminescent nanostructures. This may be attributed to certain properties of the ZnMgO nanoparticles, such as their energetic distribution, slow radiative decay, and relative high quantum yield. Some examples of materials for hole transport layer 208 include those commonly used in OLEDs, such as Poly(9,9-dioctylfluorene-alt-N-(4-sec-butylphenyl)-diphenylamine) (TFB) and N,N'-Di(1-naphthyl)-N,N'-diphenyl-(1,1'-biphenyl)-4,4'-diamine (NPB). Some examples of inorganic materials for hole transport layer 208 include copper oxide (Cu2O) or copper gallium oxide nanoparticles ($Cu_xGa_{1-x}O$).

It should be understood that the order of depositing the layers to form LED structure 200 may be reversed. In other words, material layer 202 may be formed on hole transport layer 208, and electron transport layer 206 is deposited over material layer 202 to contact the underlying hole transport layer 208 via discontinuities 204, according to an embodiment.

Figure 3:
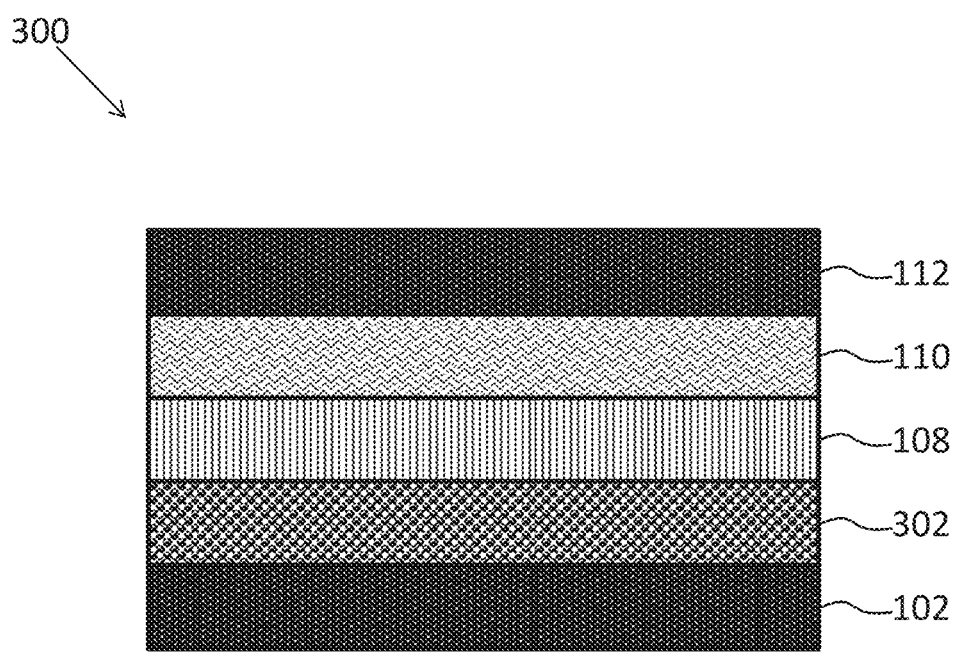
FIG. 3 illustrates another LED structure using luminescent nanoparticles, according to an embodiment.

FIG. 3 illustrates another example of an LED structure 300 that utilizes luminescent nanostructures, according to an embodiment. Many of the layers of LED structure 300 share the same labels, and/or are functionally similar to, the layers of LED structure 100. For the sake of clarity, these layers will not be described again. According to an embodiment, LED structure 300 includes a mixed layer 302 that includes both electron transport material and luminescent nanostructures in the same layer. For example, mixed layer 302 may include a mixture of ZnMgO nanoparticles and QDs. The proximity of the QDs mixed in with the electron transport material allows for the resonant energy transfer to occur between the QDs and the formed excitons. In another embodiment, mixed layer 302 includes both hole transport material and luminescent nanostructures, and hole transport layer 108 is replaced with an electron transport layer. Hole injection layer 110 may also be moved such that it is adjacent to mixed layer 302 having both hole transport material and luminescent nanostructures.

Figure 4:
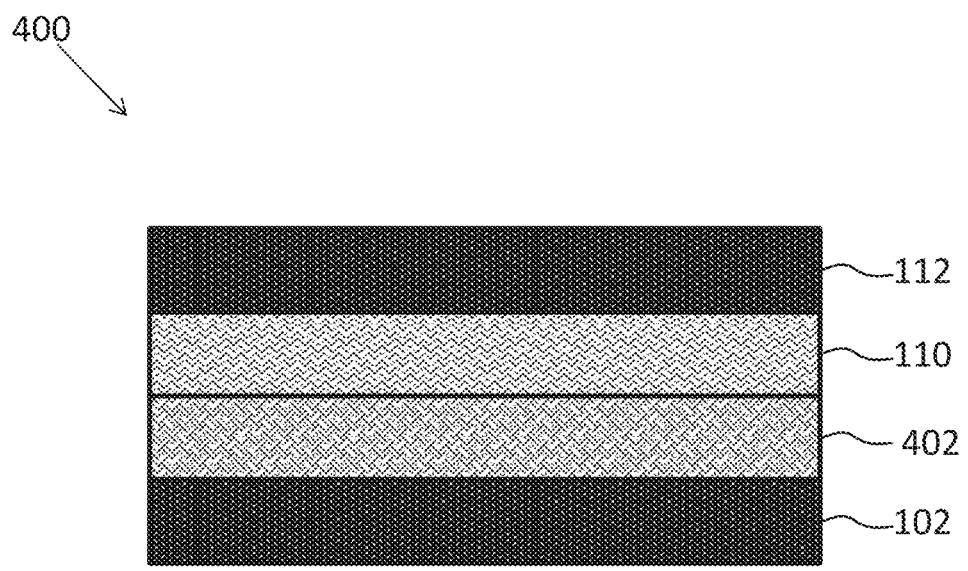
FIG. 4 illustrates another LED structure using luminescent nanoparticles, according to an embodiment.

FIG. 4 illustrates another example of an LED structure 400 that utilizes luminescent nanostructures, according to an embodiment. Many of the layers of LED structure 400 share the same labels, and/or are functionally similar to, the layers of LED structure 100. For the sake of clarity, these layers will not be described again. According to an embodiment, LED structure 400 includes a mixed layer 402 that includes multiple different materials in the same layer. For example, mixed layer 402 includes hole transport material, electron transport material, and luminescent nanostructures. In this structure, the hole generation, electron generation, and the exciton formation all occur in the same mixed layer 402. The proximity of the luminescent nanostructures in the same layer as the formed excitons allows for the resonant energy transfer to occur between the luminescent nanostructures and the excitons.

The resonant energy transfer-based QD-LED mechanism described above with reference to FIGS. 2-4 has several advantages over direct charge injection. Since electrons and holes are no longer separately injected into the QDs, high barriers to charge injection and low charge mobility within the material layer that includes the QDs do not limit device performance. This allows the shell thickness of the QDs to be significantly increased without an increase in series resistance or turn-on voltage. For example, InP core QDs may have its (ZnSe/ZnS) shell thickness increased by about 100-500%. The shell thickness may be between 1 nm and 5 nm. In order to maintain efficient energy transfer between the excitons and the QDs, the shell thickness should not exceed 20 nm, and preferably should be less than 10 nm. In some embodiments, the shell material of the QDs comprises silicon dioxide or aluminum oxide. The current-voltage characteristics of the QD-LED devices according to embodiments of the present disclosure are largely independent of zinc selenide/zinc sulfide (ZnSe/ZnS) shell thickness. Current flow through the QD-LED devices depends on the mobility and relative energetic alignment of the hole transport layer and the electron transport layer. Additionally, exciting the QDs by exciton transfer ensures that each QD core contains an equal number of electrons and holes. Since degradation in direct-injection-based QD-LEDs is typically attributed to Auger recombination resulting from a charge imbalance, the resonant energy-transfer-based QD-LEDs are more stable under continuous operation.

Figure 5:
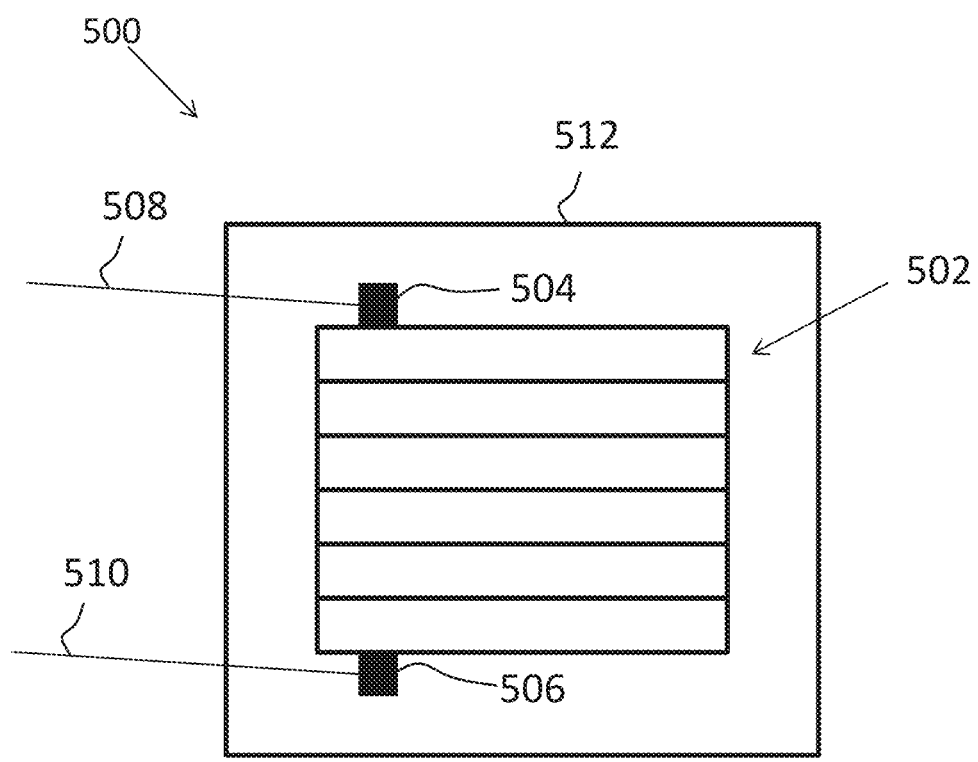
FIG. 5 illustrates a packaged LED device using luminescent nanostructures, according to an embodiment.

FIG. 5 illustrates a packaged LED device 500, according to an embodiment. LED device 500 includes a layer stack 502 that may be any of the previously described layer stacks discussed with reference to FIGS. 2-4. The top conductive layer of layer stack 502 (anode or cathode) may include a contact 504 and the bottom conductive layer of layer stack 502 (anode or cathode) may include a contact 506. Each of contact 504 and contact 506 may be a conductive material that includes a lead 508 and lead 510, respectively, to carry an electrical current. In some examples, contact 504 and/or contact 506 includes a solder joint. In other examples, contact 504 and/or contact 506 represents a planar metallic film upon which layer stack 502 is formed upon. Contacts 504 and 506 may be any conductive material that makes a good ohmic contact with the underlying layer. Example materials for contacts 504 and 506 include tin-based solder, aluminum, copper, etc.

In an embodiment, layer stack 502 is surrounded by an encapsulating material 512 that protects layer stack 502 from the environment. Encapsulating material 512 may be an epoxy resin that hardens to prevent oxygen and moisture from penetrating through the epoxy resin. Encapsulating material 512 may also cover each of contacts 504 and 506.

Figure 6:
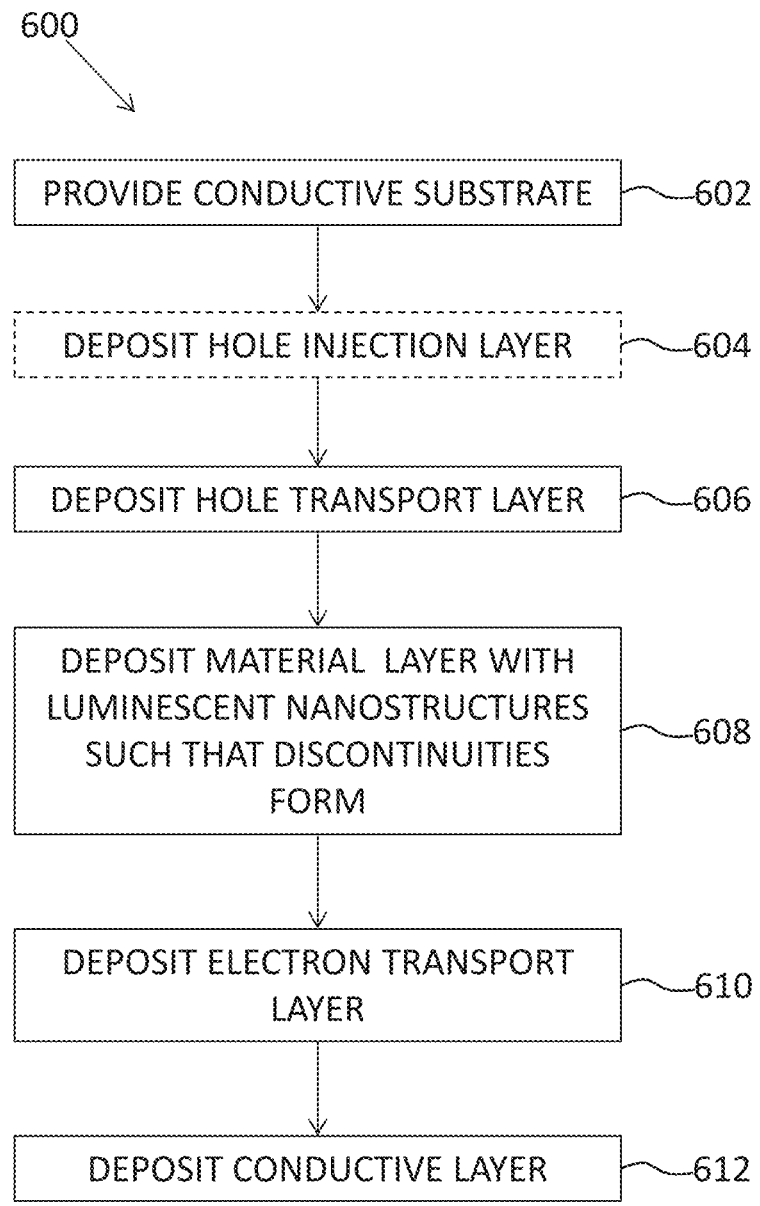
FIG. 6 illustrates a flowchart of an example fabrication method for an illumination device, according to an embodiment.

FIG. 6 illustrates an example fabrication method 600 for an illumination device. Method 600 may be performed as part of a larger process for manufacturing an illumination device. Method 600 is not intended to be exhaustive and other steps may be performed without deviating from the scope of the embodiments described herein. Furthermore, the various steps of method 600 may be performed in a different order than that illustrated.

Method 600 begins at step 602 where a conductive substrate is provided. The conductive substrate may be substantially transparent to visible light. The conductive substrate may include one or more conductive layers deposited on a non-conducting material. For example, the conductive substrate may include a layer of ITO deposited on an underlying glass substrate. In an embodiment, the conductive substrate acts as an anode of the illumination device.

Method 600 continues with optional step 604 where a hole injection layer is deposited over the conductive substrate. The hole injection layer may include poly(3,4-ethylenedioxythiophene) polystyrene sulfonate (PEDOT-PSS). In some embodiments, the hole injection layer is spin-coated to a final thickness of less than 100 nm, less than 75 nm, less than 50 nm, less than 25 nm, or less than 10 nm. After deposition onto the conductive substrate, the hole injection layer may be baked at a temperature between 150 C and 250 C for between 10 minutes to 20 minutes.

Method 600 continues with step 606 where a hole transport layer is deposited over the hole injection layer (or over the conductive substrate if the hole injection layer is not present.) The hole transport layer may include TFB or NPB.

In some embodiments, the hole transport layer is spin-coated to a final thickness of less than 50 nm, less than 25 nm, less than 10 nm, less than 5 nm, or less than 1 nm. After deposition, the hole transport layer may be baked at a temperature between 150 C and 200 C for between 25 minutes to 35 minutes.

Method 600 continues with step 608 where a material layer having luminescent nanostructures is deposited such that discontinuities form through the thickness of the material layer. The luminescent nanostructures may include QDs having materials such as indium phosphide (InP), cadmium selenide (CdSe), and gallium arsenide (GaAs). In some embodiments, the material layer is spin-coated to a final thickness less than 10 nm thick, less than 5 nm thick, less than 1 nm thick, or only one monolayer thick. The material layer may be spin-coated from an octane solution containing a concentration of luminescent nanostructures between 15 mg/mL and 0.5 mg/mL.

The final thickness of the material layer and the concentration of luminescent nanostructures within the spun-on solution may be adjusted to facilitate the formation of discontinuities through the thickness of the material layer, according to an embodiment. The discontinuities may have any shape or pattern. In some examples, the discontinuities are randomly spread across the surface of the material layer. In other examples, the discontinuities are formed in a specific pattern, or encouraged to form, using one or more applied techniques, such as etching of the material layer.

Method 600 continues with step 610 where an electron transport layer is deposited over the material layer. The electron transport layer may be spin-coated from a solution of colloidal nanocrystals. The colloidal nanocrystals may include ZnMgO nanoparticles. In some embodiments, the electron transport layer is spin-coated to a final thickness of less than 150 nm, less than 125 nm, less than 100 nm, less than 75 nm, less than 60 nm, or less than 50 nm.

Because of the presence of the discontinuities through the material layer, the electron transport layer contacts the hole transport layer via the discontinuities. The contact may form when the deposition of the electron transport layer over the material layer also deposits within the discontinuities, thus contacting the lower hole transport layer.

Method 600 continues with step 612 where a conductive layer is deposited over the electron transport layer. The conductive layer acts as a cathode of the illumination device, according to an embodiment. The conductive layer may include one or more conductive layers deposited on a non-conducting material. For example, the conductive layer may include a layer of ITO deposited on an underlying glass substrate. The conductive layer may be substantially transparent to visible light. In another example, the conductive layer includes one of aluminum, gold, or silver. The conductive layer may be deposited to a final thickness of less than 200 nm, less than 175 nm, less than 150 nm, less than 125 nm, less than 100 nm, or less than 50 nm. In an embodiment, the conductive layer is deposited using thermal evaporation.

It should be understood that the order of deposited layers in method 600 may be changed or reversed. For example, the electron transport layer may be deposited first over the conductive substrate, followed sequentially by the material layer and the hole transport layer. In such an embodiment, the conductive substrate acts as a cathode while the conductive layer acts as an anode.

Example Embodiments of Quantum Dots

As discussed in the embodiments herein, illumination devices may include a layer of luminescent nanostructures. These luminescent nanostructures may include QDs, such as colloidally-grown core-shell QDs.

Figure 7:
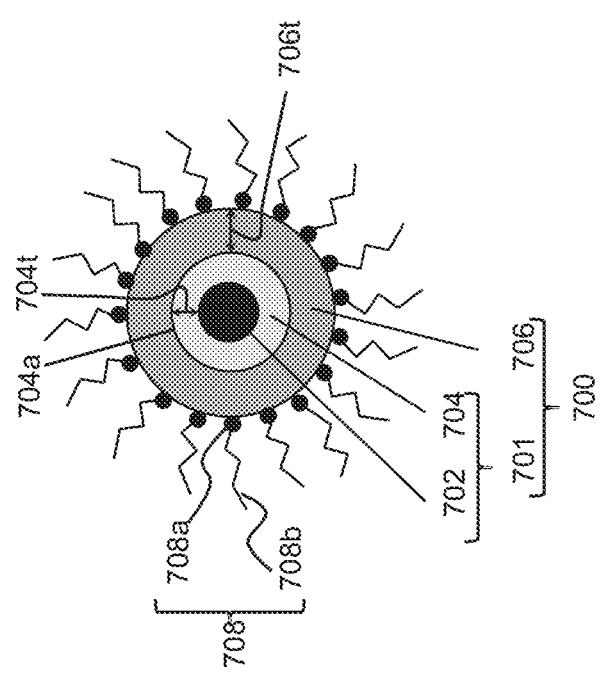
FIG. 7 is a schematic of a cross-sectional view of a nanostructure, according to an embodiment.

FIG. 7 illustrates a cross-sectional structure of a barrier layer coated luminescent nanostructure (NS) 700, according to an embodiment. Barrier layer coated NS 700 includes a NS 701 and a barrier layer 706. NS 701 includes a core 702 and a shell 704. Core 702 includes a semiconducting material that emits light upon absorption of higher energies. Examples of the semiconducting material for core 702 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap may be used as well. In an embodiment, core 702 may also include one or more dopants such as metals, alloys, to provide some examples. Examples of metal dopant may include, but not limited to, zinc (Zn), Copper (Cu), aluminum (Al), platinum (Pt), chrome (Cr), tungsten (W), palladium (Pd), or a combination thereof. The presence of one or more dopants in core 702 may improve structural and optical stability and QY of NS 701 compared to undoped NSs.

Core 702 may have a size of less than 20 nm in diameter, according to an embodiment. In another embodiment, core 702 may have a size between about 1 nm and about 5 nm in diameter. The ability to tailor the size of core 702, and consequently the size of NS 701 in the nanometer range enables photoemission coverage in the entire optical spectrum. In general, the larger NSs emit light towards the red end of the spectrum, while smaller NSs emit light towards the blue end of the spectrum. This effect arises as larger NSs have energy levels that are more closely spaced than the smaller NSs. This allows the NS to absorb photons containing less energy, i.e. those closer to the red end of the spectrum.

Shell 704 surrounds core 702 and is disposed on outer surface of core 702. Shell 704 may include cadmium sulfide (CdS), zinc cadmium sulfide (ZnCdS), zinc selenide sulfide (ZnSeS), and zinc sulfide (ZnS). In an embodiment, shell 704 may have a thickness 704t, for example, one or more monolayers. In other embodiments, shell 704 may have a thickness 704t between about 1 nm and about 5 nm. Shell 704 may be utilized to help reduce the lattice mismatch with core 702 and improve the QY of NS 701. Shell 704 may also help to passivate and remove surface trap states, such as dangling bonds, on core 702 to increase QY of NS 701. The presence of surface trap states may provide non-radiative recombination centers and contribute to lowered emission efficiency of NS 701.

In alternate embodiments, NS 701 may include a second shell disposed on shell 704, or more than two shells surrounding core 702, without departing from the spirit and scope of the present invention. In an embodiment, the second shell may be on the order of two monolayers thick and is typically, though not required, also a semiconducting material. Second shell may provide protection to core 702. Second shell material may be zinc sulfide (ZnS), although other materials may be used as well without deviating from the scope or spirit of the invention.

Barrier layer 706 is configured to form a coating on NS 701. In an embodiment, barrier layer 706 is disposed on and in substantial contact with outer surface 704a of shell 704. In embodiments of NS 701 having one or more shells, barrier layer 706 may be disposed on and in substantial contact with the outermost shell of NS 701. In an example embodiment, barrier layer 706 is configured to act as a spacer between NS 701 and one or more NSs in, for example, a solution, a composition, and/or a film having a plurality of NSs, where the plurality of NSs may be similar to NS 701 and/or barrier layer coated NS 700. In such NS solutions, NS compositions, and/or NS films, barrier layer 706 may help to prevent aggregation of NS 701 with adjacent NSs. Aggregation of NS 701 with adjacent NSs may lead to increase in size of NS 701 and consequent reduction or quenching in the optical emission properties of the aggregated NS (not shown) including NS 701. In further embodiments, barrier layer 706 provides protection to NS 701 from, for example, moisture, air, and/or harsh environments (e.g., high temperatures and chemicals used during lithographic processing of NSs and/or during manufacturing process of NS based devices) that may adversely affect the structural and optical properties of NS 701.

Barrier layer 706 includes one or more materials that are amorphous, optically transparent and/or electrically inactive. Suitable barrier layers include inorganic materials, such as, but not limited to, inorganic oxides and/or nitrides. Examples of materials for barrier layer 706 include oxides and/or nitrides of Al, Ba, Ca, Mg, Ni, Si, Ti, or Zr, according to various embodiments. Barrier layer 706 may have a thickness 706t ranging from about 8 nm to about 15 nm in various embodiments.

As illustrated in FIG. 7, barrier layer coated NS 700 may additionally or optionally include a plurality of ligands or surfactants 708, according to an embodiment. Ligands or surfactants 708 may be adsorbed or bound to an outer surface of barrier layer coated NS 700, such as on an outer surface of barrier layer 706, according to an embodiment. The plurality of ligands or surfactants 708 may include hydrophilic or polar heads 708a and hydrophobic or non-polar tails 708b. The hydrophilic or polar heads 708a may be bound to barrier layer 706. The presence of ligands or surfactants 708 may help to separate NS 700 and/or NS 701 from other NSs in, for example, a solution, a composition, and/or a film during their formation. If the NSs are allowed to aggregate during their formation, the quantum efficiency of NSs such as NS 700 and/or NS 701 may drop. Ligands or surfactants 708 may also be used to impart certain properties to barrier layer coated NS 700, such as hydrophobicity to provide miscibility in non-polar solvents, or to provide reaction sites (e.g., reverse micellar systems) for other compounds to bind.

A wide variety of ligands exist that may be used as ligands 708. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is diphenylphosphine.

A wide variety of surfactants exist that may be used as surfactants 708. Nonionic surfactants may be used as surfactants 708 in some embodiments. Some examples of nonionic surfactants include polyoxyethylene (5) nonylphenylether (commercial name IGEPAL CO-520), polyoxyethylene (9) nonylphenylether (IGEPAL CO-630), octylphenoxy poly(ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), and polyoxyethylene branched nonylcyclohexyl ether (Triton N-101).

Anionic surfactants may be used as surfactants 708 in some embodiments. Some examples of anionic surfactants include sodium dioctyl sulfosuccinate, sodium stearate, sodium lauryl sulfate, sodium monododecyl phosphate, sodium dodecylbenzenesulfonate, and sodium myristyl sulfate.

In some embodiments, NSs 701 and/or 700 may be synthesized to emit light in one or more various color ranges, such as red, orange, and/or yellow range. In some embodiments, NSs 701 and/or 700 may be synthesized to emit light in the green and/or yellow range. In some embodiments, NSs 701 and/or 700 may be synthesized emit light in the blue, indigo, violet, and/or ultra-violet range. In some embodiments, NSs 701 and/or 700 may be synthesized to have a primary emission peak wavelength between about 605 nm and about 650 nm, between about 510 nm and about 550 nm, or between about 300 nm and about 480 nm.

NSs 701 and/or 700 may be synthesized to display a high QY. In some embodiments, NSs 701 and/or 700 may be synthesized to display a QY between 80% and 95% or between 85% and 90%.

Thus, according to various embodiments, NSs 700 may be synthesized such that the presence of barrier layer 706 on NSs 701 does not substantially change or quench the optical emission properties of NSs 701.

Figure 8:
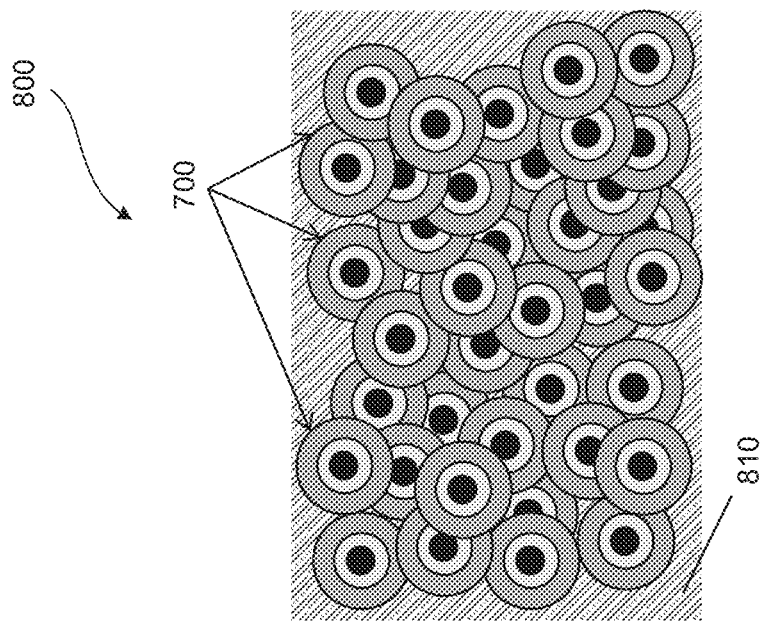
FIG. 8 is a schematic of a nanostructure film, according to an embodiment.

FIG. 8 illustrates a cross-sectional view of a NS film 800, according to an embodiment. NS film 800 may include a plurality of barrier layer coated core-shell NSs 700 (FIG. 6) and a matrix material 810, according to an embodiment. NSs 700 may be embedded or otherwise disposed in matrix material 810, according to some embodiments. As used herein, the term "embedded" is used to indicate that the NSs are enclosed or encased within matrix material 810 that makes up the majority component of the matrix. It should be noted that NSs 700 may be uniformly distributed throughout matrix material 810 in an embodiment, though in other embodiments NSs 700 may be distributed according to an application-specific uniformity distribution function. It should be noted that even though NSs 700 are shown to have the same size in diameter, a person skilled in the art would understand that NSs 700 may have a size distribution.

In an embodiment, NSs 700 may include a homogenous population of NSs having sizes that emit in the blue visible wavelength spectrum, in the green visible wavelength spectrum, or in the red visible wavelength spectrum. In other embodiments, NSs 700 may include a first population of NSs having sizes that emit in the blue visible wavelength spectrum, a second population of NSs having sizes that emit in the green visible wavelength spectrum, and a third population of NSs that emit in the red visible wavelength spectrum.

Matrix material 810 may be any suitable host matrix material capable of housing NSs 700. Suitable matrix materials may be chemically and optically compatible with NSs 700 and any surrounding packaging materials or layers used in applying NS film 800 to devices. Suitable matrix materials may include non-yellowing optical materials which are transparent to both the primary and secondary light, thereby allowing for both primary and secondary light to transmit through the matrix material. In an embodiment, matrix material 810 may completely surround each of the NSs 700. The matrix material 810 may be flexible in applications where a flexible or moldable NS film 800 is desired.

Alternatively, matrix material 810 may include a high-strength, non-flexible material.

Matrix material 810 may include polymers and organic and inorganic oxides. Suitable polymers for use in matrix material 810 may be any polymer known to the ordinarily skilled artisan that can be used for such a purpose. The polymer may be substantially translucent or substantially transparent. Matrix material 810 may include, but not limited to, epoxies, acrylates, norbornene, polyethylene, poly(vinyl butyral):poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with bifunctional monomers, such as divinylbenzene; cross-linkers suitable for cross-linking ligand materials, epoxides which combine with ligand amines (e.g., APS or PEI ligand amines) to form epoxy, and the like.

In some embodiments, matrix material 810 includes scattering microbeads such as $TiO_2$ microbeads, ZnS microbeads, or glass microbeads that may improve photo conversion efficiency of NS film 800. In some embodiments, matrix material 810 may include light blocking elements such as light blocking elements 238 and/or 548 described above with reference to FIGS. 2-3 and 5.

In another embodiment, matrix material 810 may have low oxygen and moisture permeability, exhibit high photo- and chemical-stability, exhibit favorable refractive indices, and adhere to outer surfaces of NSs 700, thus providing an air-tight seal to protect NSs 700. In another embodiment, matrix material 810 may be curable with UV or thermal curing methods to facilitate roll-to-roll processing.

According to some embodiments, NS film 800 may be formed by mixing NSs 700 in a polymer (e.g., photoresist) and casting the NS-polymer mixture on a substrate, mixing NSs 700 with monomers and polymerizing them together, mixing NSs 700 in a sol-gel to form an oxide, or any other method known to those skilled in the art.

According to some embodiments, the formation of NS film 800 may include a film extrusion process. The film extrusion process may include forming a homogenous mixture of matrix material 810 and barrier layer coated core-shell NSs such as NS 700, introducing the homogenous mixture into a top mounted hopper that feeds into an extruder. In some embodiments, the homogenous mixture may be in the form of pellets. The film extrusion process may further include extruding NS film 800 from a slot die and passing extruded NS film 800 through chill rolls. In some embodiments, the extruded NS film 800 may have a thickness less than about 75 µm, for example, in a range from about 70 µm to about 40 µm, from about 65 µm to about 40 µm, from about 60 µm to about 40 µm, or form about 50 µm to about 40 µm. In some embodiments, NS film 800 has a thickness less than about 10 µm. In some embodiments, the formation of NS film 800 may optionally include a secondary process followed by the film extrusion process. The secondary process may include a process such as co-extrusion, thermoforming, vacuum forming, plasma treatment, molding, and/or embossing to provide a texture to a top surface of NS film 800. The textured top surface NS film 800 may help to improve, for example defined optical diffusion property and/or defined angular optical emission property of NS film 800.

Illumination Device: Example 1

A first example illumination device was prepared by using a combination of spin-coating and thermal evaporation to from the various layers. First, a hole injection material (PEDOT-PSS) was spin-coated to a thickness of about 50 nm onto a UV-ozone-treated ITO substrate and baked for 15 minutes at 200 C. The device was transferred to an inert atmosphere and a hole transport material (TFB) was then deposited by spin-coating to a final thickness of about 20 nm and baked at 135 C for 20 minutes. One monolayer of InP/ZnSe/ZnS QDs was then deposited by spin-coating from a 9 mg/mL octane solution. The QDs used in this device include a 3-4 nm InP core with a nominal shell composition of 6.5 ML ZnSe and 3 ML ZnS. When measured in a HTL/QD/ETL sandwich structure, the InP/ZnSe/ZnS QDs have a film QY of ~40%. After the deposition of the QD layer, a ZnMgO electron transport layer was deposited by spin-coating to a final thickness of about 60 nm from a solution of colloidal nanocrystals. An Al cathode was then deposited by thermal evaporation to a final thickness of about 150 nm, and the device was encapsulated using a cap-glass, getter, and epoxy resin.

Figure 9A:
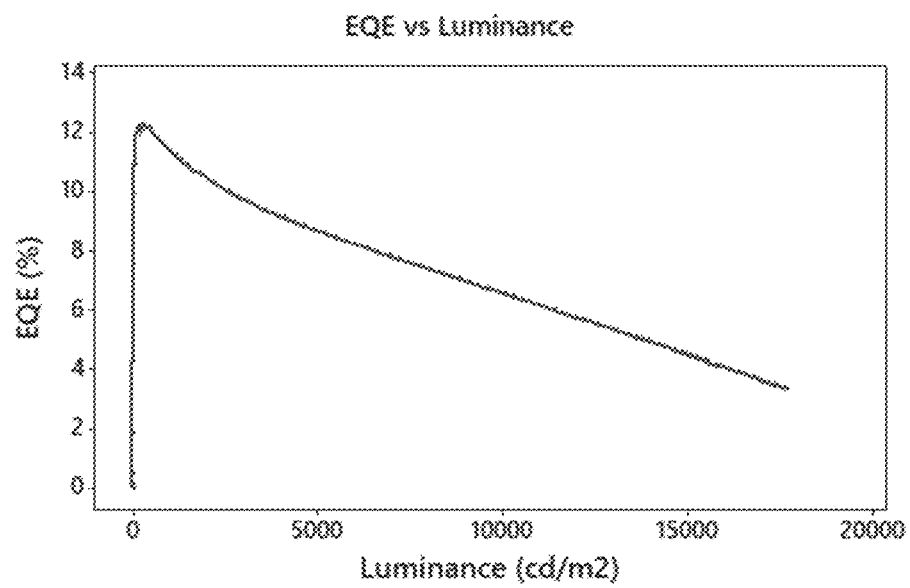
FIGS. 9A and 9B illustrate device characteristics of LED devices using luminescent nanostructures, according to some embodiments.
Figure 9B:
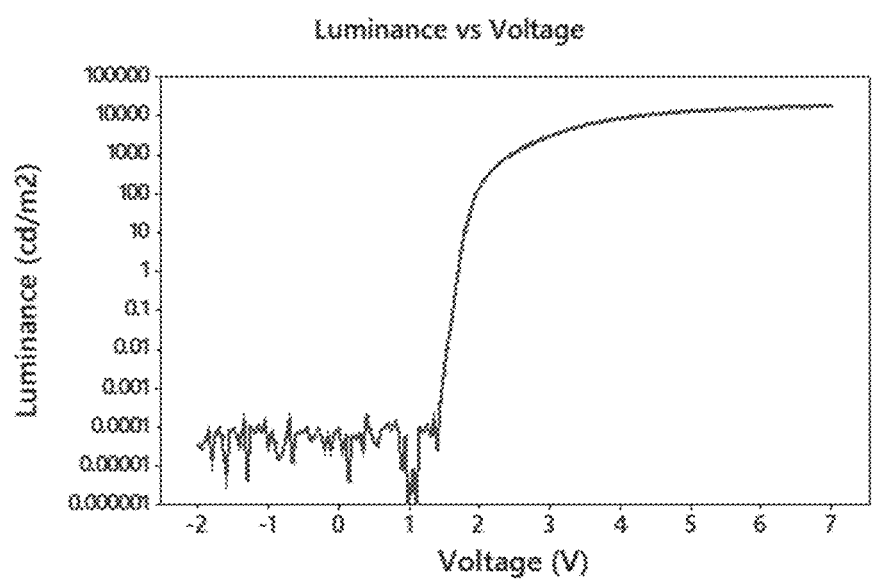

FIG. 9A illustrates a data plot showing the external quantum efficiency (EQE) vs. luminance of the InP/ZnSe/ZnS QDs from the described first example illumination device. The maximum achieved EQE of 12.3% is significantly higher than anything previously reported for non-cadmium based QDs. FIG. 9B illustrates a data plot showing the luminance vs. applied voltage for the described first example illumination device. As a result of the highly efficient resonant energy transfer, a low turn-on voltage of about 1.5 V is achieved for the illumination device.

Illumination Device: Example 2

A second example illumination device was prepared by using a combination of spin-coating and thermal evaporation to from the various layers. First, a hole injection material (PEDOT-PSS) was spin-coated to a thickness of about 50 nm onto a UV-ozone-treated ITO substrate and baked for 15 minutes at 200 C. The device was transferred to an inert atmosphere and a hole transport material (HT2310) was then deposited by spin-coating to a final thickness of about 25 nm and baked at 170 C for 30 minutes. One monolayer of InP/ZnSe/ZnS QDs was then deposited by spin-coating from a 0.09 mg/mL octane solution. The QDs used in this device include a 3-4 nm InP core with a nominal shell composition of 6.5 ML ZnSe and 3 ML ZnS. When measured in a HTL/QD/ETL sandwich structure, the InP/ZnSe/ZnS QDs have a film QY of ~40%. After the deposition of the QD layer, a ZnMgO electron transport layer was deposited by spin-coating to a final thickness of about 60 nm from a solution of colloidal nanocrystals. An Al cathode was then deposited by thermal evaporation to a final thickness of about 150 nm, and the device was encapsulated using a cap-glass, getter, and epoxy resin.

Figure 10:
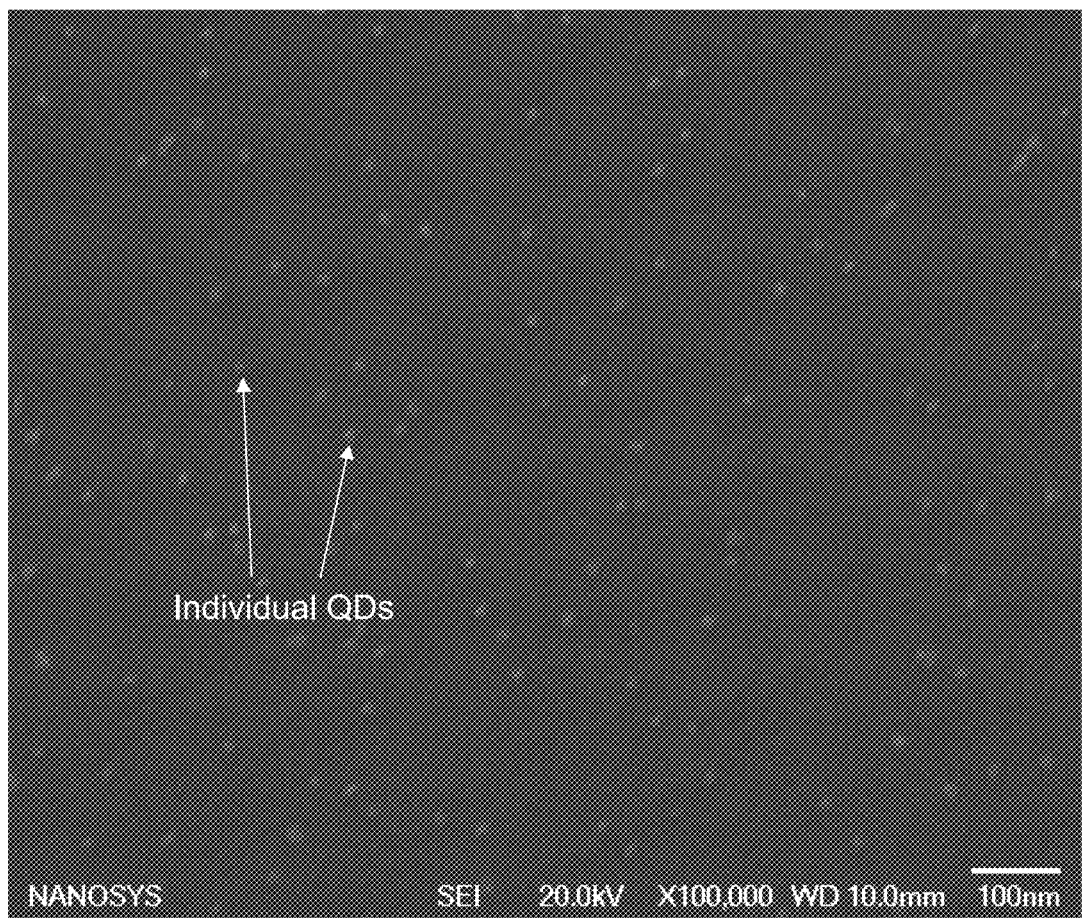
FIG. 10 is a scanning electron microscope (SEM) image of a portion of an illumination device, according to an embodiment.

FIG. 10 provides an SEM taken of the second example illumination device after the deposition of the InP/ZnSe/ZnS QDs. The image shows widely-spaced individual QDs which cover about 1% of the total pixel area as a result of using a lower concentration of QDs in the octane solution. Rather than a continuous monolayer of QDs, each QD in the second example illumination device is surrounded by the hole transport material and the electron transport material (e.g., ZnMgO.) Because of the efficiency of the ZnMgO→QD energy transfer, the electroluminescence spectrum of the second example illumination device still consists almost entirely of QD emission, rather than parasitic emission from the electron transport layer.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An illumination device, comprising:
a first conductive layer;
a second conductive layer;
a hole transport layer disposed between the first conductive layer and the second conductive layer;
an electron transport layer disposed between the first conductive layer and the second conductive layer; and
a layer of plurality of luminescent nanostructures, wherein the layer of plurality of luminescent nanostructures is disposed between the electron transport layer and the hole transport layer,
wherein the layer of plurality of luminescent nanostructures comprises a plurality of discontinuities through a thickness of the layer of plurality of luminescent nanostructures such that the hole transport layer and the electron transport layer directly contact each other at planar interfaces disposed at the plurality of discontinuities,
wherein the planar interfaces are coplanar with a planar bottom surface of the layer of plurality of luminescent nanostructures.

2. The illumination device of claim 1, wherein the plurality of luminescent nanostructures comprises a plurality of quantum dots.

3. The illumination device of claim 2, wherein the plurality of quantum dots comprises quantum dots having a core-shell structure, wherein a shell of the core-shell structure has a thickness between 1 nanometer and 5 nanometers.

4. The illumination device of claim 3, wherein the plurality of quantum dots comprises quantum dots having a core material, of the core-shell structure, of indium phosphide (InP).

5. The illumination device of claim 1, wherein the layer of plurality of luminescent nanostructures has a thickness of one monolayer.

6. The illumination device of claim 1, wherein the plurality of discontinuities forms a random pattern.

7. The illumination device of claim 1, wherein the plurality of discontinuities forms a regular pattern.

8. The illumination device of claim 1, further comprising a hole injection layer disposed between the first conductive layer and the hole transport layer.

9. The illumination device of claim 1, wherein the electron transport layer comprises a plurality of zinc magnesium oxide (ZnMgO) nanocrystals.

10. A quantum dot light emitting diode (QD-LED) device, comprising:
a layer stack comprising:
a first conductive layer,
a second conductive layer,
a hole transport layer disposed between the first conductive layer and the second conductive layer,
an electron transport layer disposed between the first conductive layer and the second conductive layer, and
a plurality of quantum dots, wherein the plurality of quantum dots is disposed in a separate layer between the electron transport layer and the hole transport layer,
wherein the separate layer comprises a plurality of discontinuities through a thickness of the separate layer such that the hole transport layer and the electron transport layer directly contact each other at planar interfaces disposed at the plurality of discontinuities, and
wherein the planar interfaces are coplanar with a planar bottom surface of the separate layer;
a first contact coupled to the first conductive layer;
a second contact coupled to the second conductive layer; and
an encapsulating material configured to surround the layer stack.

11. The QD-LED device of claim 10, wherein the encapsulating material comprises an epoxy resin.

12. The QD-LED device of claim 10, wherein the plurality of quantum dots comprises quantum dots having a core-shell structure, wherein a shell of the core-shell structure has a thickness between 1 nanometer and 5 nanometers.

13. The QD-LED device of claim 12, wherein the plurality of quantum dots comprises quantum dots having a core material, of the core-shell structure, of indium phosphide (InP).

14. The QD-LED device of claim 10, wherein the separate layer has a thickness of one monolayer.

15. The QD-LED device of claim 10, wherein the layer stack further comprises a hole injection layer disposed between the first conductive layer and the hole transport layer.

16. The QD-LED device of claim 10, wherein the electron transport layer comprises a plurality of zinc magnesium oxide (ZnMgO) nanocrystals.

* * * * *